United States Patent [19]

Childers

[11] Patent Number: 5,251,178
[45] Date of Patent: Oct. 5, 1993

[54] LOW-POWER INTEGRATED CIRCUIT MEMORY

[76] Inventor: Jimmie D. Childers, 1306 Village Garden Dr., Missouri City, Tex. 77459

[21] Appl. No.: 665,388

[22] Filed: Mar. 6, 1991

[51] Int. Cl.⁵ .............................................. G11C 7/00
[52] U.S. Cl. ................................ 365/227; 365/230.03
[58] Field of Search ........................... 365/227, 230.03

[56] References Cited

U.S. PATENT DOCUMENTS 5,121,358  6/1992  Slemmer et al. ........... 365/230.03 X

FOREIGN PATENT DOCUMENTS 284276  9/1988  European Pat. Off. ............ 365/227
298596  12/1989  Japan ..................................... 365/227

Primary Examiner—James B. Mullins
Attorney, Agent, or Firm—Theodore D. Lindgren; Leo N. Heiting; Richard L. Donaldson

[57] ABSTRACT

In accordance with one embodiment of the invention, an integrated circuit memory capable of receiving address signals has a plurality of array banks. Each array bank has a plurality of memory cells arranged in rows and columns and has a means for addressing the rows and columns of the array banks in response to the address signals. The integrated circuit includes a means for de-coupling power from at least one array bank in response to at least one bit of an address signal.

12 Claims, 3 Drawing Sheets

LOW-POWER INTEGRATED CIRCUIT MEMORY

BACKGROUND OF THE INVENTION

This invention relates to semiconductor memory devices and, more particularly, to minimizing energy requirements for integrated circuit memories such as Dynamic Random Access Memories (DRAMs).

In general, semiconductor memory devices such as DRAMs are formed from sub-arrays, or banks, of memory cells. For example, a four-megabit DRAM may be formed on a chip using four banks, each bank including one million memory cells.

The memory cells of each array bank are formed in rows and columns. Each memory cell in a row is connected to a conductive row line and each memory cell in a column is connected to at least one conductive column line. Row addresses are applied to the row lines and column addresses are applied to the column lines for the purpose of storing and reading digital data in the memory cells and, in the case of DRAMs, refreshing the memory cells. The digital data is sensed by sense amplifiers connected to the column lines of each bank. For example, 4096 sense amplifiers are required for a four-megabit DRAM having four banks, each bank having 1024 columns of cells and 1024 rows of cells.

The number of row address bits received by a DRAM from a microprocessor may, by industry standard, be equal to the number of column address bits. For example, the row address signals and the column address signals furnished by a microprocessor to a four-megabit DRAM may each have 11 bits. However, if that same four-megabit DRAM includes four array banks, each bank having 1024 columns and 1024 rows of memory cells, then the information from the column address bits and from the row address bits must be redefined to conform to the array bank configuration. In redefining the bits, one or more of the row bits may be assigned to address one or more columns in a bank or banks of cells. Similarly, one or more of the column bits may be assigned to designate a particular bank in which data may be stored or read.

SUMMARY OF THE INVENTION

In accordance with one embodiment of the invention, an integrated circuit memory capable of receiving address signals has a plurality of array banks. Each array bank has a plurality of memory cells arranged in rows and columns and has a means for addressing the rows and columns of the array banks in response to the address signals. The integrated circuit includes a means for de-coupling electrical power from at least one array bank in response to at least one bit of an address signal.

DETAILED DESCRIPTION OF SPECIFIC EMBODIMENTS

Figure 1:
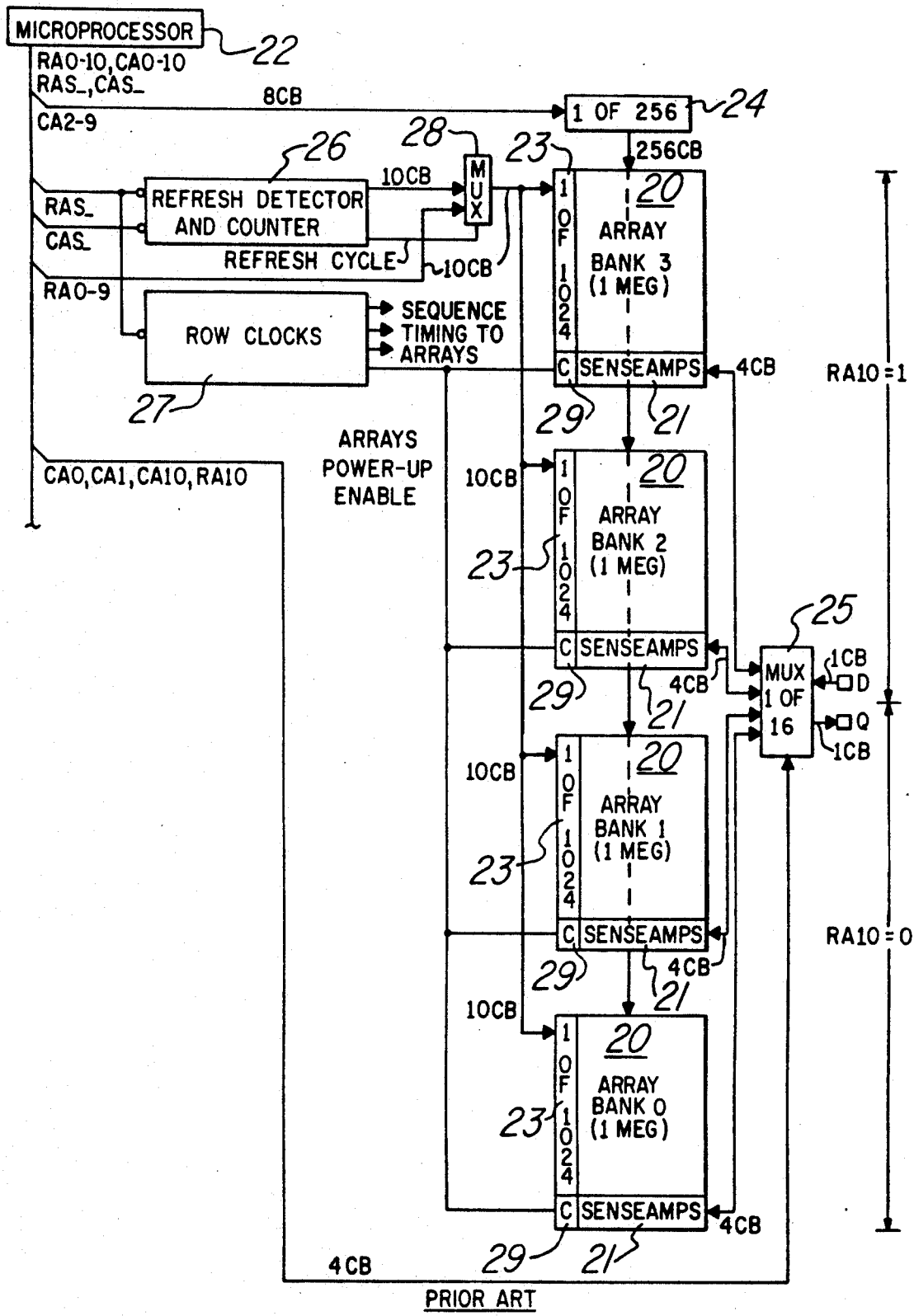
FIG. 1 is a schematic circuit representation, in partial block form, relevant parts of an example dynamic random access memory.

Referring to FIG. 1, a prior-art memory device is illustrated in block diagram form. The memory device used for illustration purposes is a random access, read/write memory of the dynamic type, made by a N-channel, self-aligned, silicon gate CMOS process. The example DRAM device includes 4,194,304 memory cells split into four ARRAY BANKs 20 of 1,048,576 cells each, each ARRAY BANK 20 having a regular pattern of 1024 rows and 1024 columns. There are 1024 sense amplifiers (SENSEAMPS 21) in each ARRAY BANK 20, each sense amplifier connected to a column line. In the prior-art circuit of FIG. 1, all of the 4096 sense amplifiers are activated during operation. Each sense amplifier, as well as other elements of each ARRAY BANK 20, draw energy from a source of electrical power, such as a supply voltage source, whether or not a column of that ARRAY BANK 20 is being read.

In the prior-art, it is common for a MICROPROCESSOR 22 to furnish, for example, eleven row or X addresses RA0-10 and eleven column or Y addresses CA0-10 to a memory chip having 4,194,304 memory cells. Many memory chips, such as that of the example circuit of FIG. 1, have a different number of columns than the number of rows. In the FIG. 1 prior-art example, one of the row addresses, RA10, is treated as a column address. Therefore, the device of FIG. 1 is arranged to utilize a ten-bit row address RA0-9 and twelve-bit column address CA0-10,RA10. The ten-bit row address RA0-9 is applied to the inputs of each of the four 1-of-1024 row decoders 23 by a ten-conductor bus 10CB. The row decoders 23 function to select 1-of-1024 row lines of each array as defined by the ten-bit row address RA0-9. One corresponding row line in each ARRAY BANK 20 is selected by the same ten-bit row address RA0-9.

Eight bits CA2-9 of the twelve-bit column address CA0-10,RA10 are applied to the input of 1-of-256 column decoder 24 by an eight-conductor bus 8CB. The column decoder 24 functions to select a group of 4-of-1024 columns in each of the four ARRAY BANKs 20, the group of four columns defined by the eight-bit column address CA2-9. A corresponding group of four columns is selected in each ARRAY BANK 20 by the same eight-bit column address CA2-9.

The 4-of-1024 selection (or the one-group-of-256-groups selection) made by the column decoder 24 causes each corresponding group of four columns in each array to be coupled by a four-conductor bus 4CB to a 1-of-16 multiplexer (MUX) 25. The 1-of-16 multiplexer 25 selects one column of the sixteen columns, based on a received signal containing four bits CA0,-CA1,CA10,RA10 of the twelve-bit column address CA0-10,RA10 and couples the data of the selected column through the one-conductor bus 1CB to the data input/output terminal D or Q. As is well-known, DRAMs may be configured such that MUX 25 selects, for example, four to the sixteen columns or eight of sixteen columns to provide four or eight output bits in parallel to multiple D/Q terminals.

The row address RA0-9 must appear at the row decoders 23 when a row address strobe signal RAS_ is applied to an input of the REFRESH DETECTOR AND COUNTER circuit 26 and to the ROW CLOCKS circuit 27, the latter of which generates a large number of clock and control signals to define the operation of various parts of the device each ARRAY BANK 20. Likewise, a column address strobe signal CAS_ is applied to the REFRESH DETECTOR AND COUNTER circuit 26. The CAS_ signal causes column address CA2-9 to appear at the column decoder 24 of the memory chip. Signals derived from the RAS\_ signal and the CAS\_ signal cause the memory cells of each ARRAY BANK 20 to be refreshed (cause the capacitors of the cells to be recharged). REFRESH DETECTOR AND COUNTER circuit 26 provides a REFRESH CYCLE signal to a multiplexer (MUX) 28, which in turn provides row address signals RA0-9 to the row decoders 23 of each ARRAY BANK 20. It should be noted that the schematic circuitry for the column refresh signals is not shown in FIG. 1. However, such circuitry is well-known in the prior-art and is described, for example, in U.S. Pat. No. 4,670,878 issued Jun. 2, 1987 and in U.S. Pat. No. 4,969,123 issued Incorporated.

While the RAS\_ and CAS\_ signals are illustrated in FIG. 1 as being furnished by MICROPROCESSOR 22, those signals may be generated on the DRAM chip itself or may be furnished by an intermediate chip, as is well-known in the art.

One of the signals that the ROW CLOCKS circuit 27 of FIG. 1 furnishes is an ARRAY POWER-UP ENABLE signal, which is transmitted to a control circuit (C) 29 of each ARRAY BANK 20. The control circuits 29 apply power to various components, including the SENSEAMPS 21 of each ARRAY BANK 20.

As noted at the right side of FIG. 1, the columns of ARRAY BANK 3 and ARRAY BANK 2 are selected for reading by address RA10 = 1, while the columns of ARRAY BANK 1 and ARRAY BANK 0 are selected for reading by address RA10=0.

Figure 2:
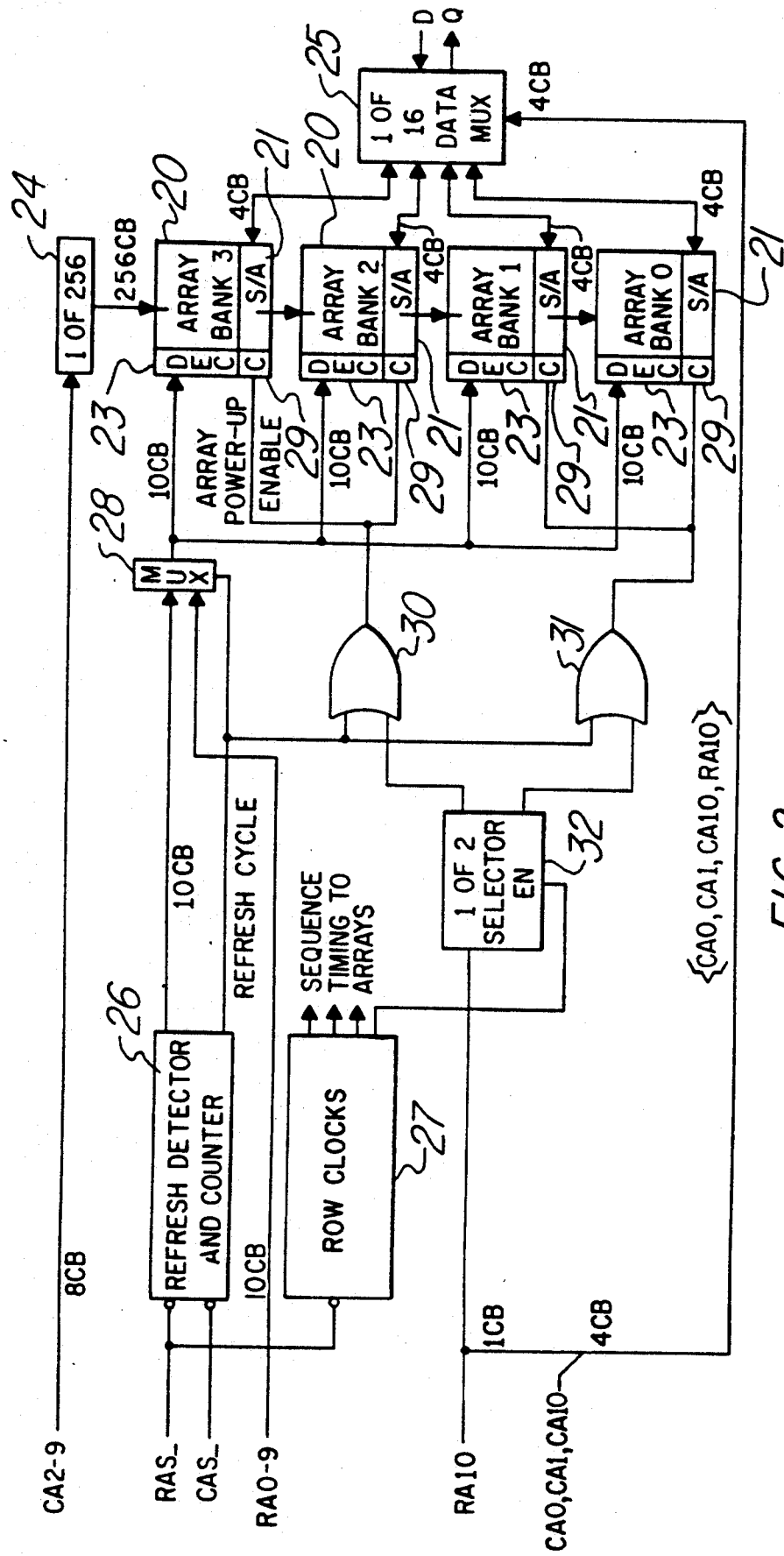
FIG. 2 is a schematic circuit representation of a form of embodiment for this invention.

Referring now to FIG. 2, the circuit of FIG. 1 has been modified to utilize the fact that, when RA10=1, only one half of the ARRAY BANKs 20 are being utilized and that, when RA10=0, the other half of the ARRAY BANKs 20 are being utilized. In particular, the RA 10 address is used to cause only the half of the ARRAY BANKs 20 that are being utilized to draw power from the DRAM energy source during read/write operations, while at the same time permitting the periodic performance of the refresh cycle in the usual manner on all ARRAY BANKs.

Specifically in reference to FIG. 2, the control circuits 29 of ARRAY BANK 3 and ARRAY BANK 2 are coupled to the output of OR circuit 30, while the control circuits 29 of ARRAY BANK 1 and ARRAY BANK 0 are coupled to the output of OR circuit 31. One input of each of OR circuits 30 and 31 is coupled to the REFRESH CYCLE output of REFRESH DETECTOR AND COUNTER circuit 26. The other inputs of OR circuits 30 and 31 are respectively coupled to the outputs one-of-two SELECTOR circuit 32. The enabling input EN of one-of-two SELECTOR circuit 32 is coupled to the ARRAY POWER-UP ENABLE output of ROW CLOCKS circuit 27. The input of one-of-two SELECTOR circuit 32 is coupled to row address RA10.

Figure 3:
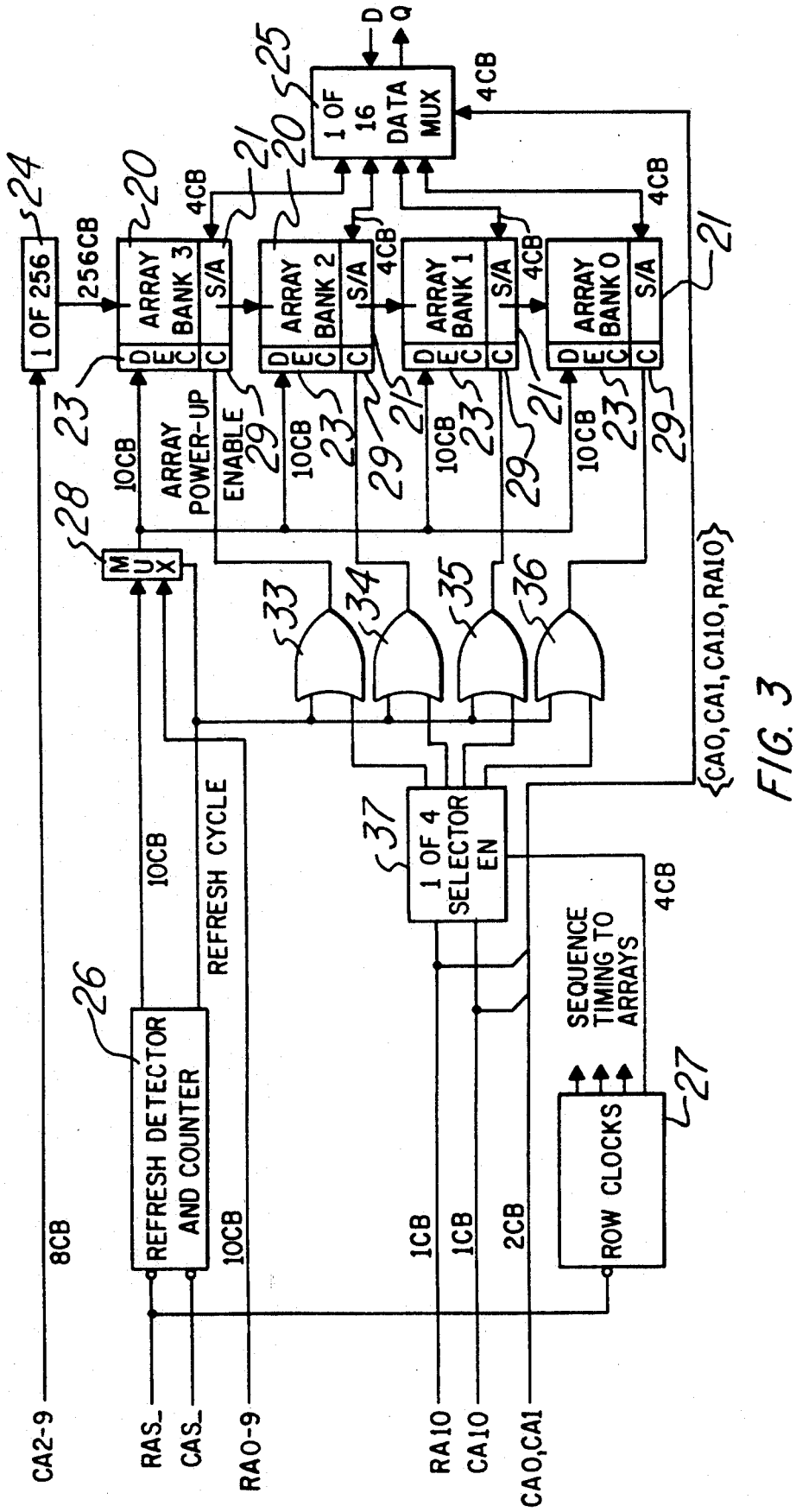
FIG. 3 is a schematic circuit representation of a second form of embodiment for this invention.

Referring now to FIG. 3, the circuit of FIG. 1 has been modified to utilize the fact that when RA10=1 and when CA10=1 only ARRAY BANK 3 is being utilized, that when RA10=1 and when CA10=0 only ARRAY BANK 2 is being utilized, that when RA10=0 and CA10=1 only ARRAY BANK 1 is being utilized, and that when RA10=0 and CA10=0 only ARRAY BANK 0 is being utilized. In particular, the RA 10 and CA10 addresses are used to cause only the ARRAY BANK 20 that is being utilized to draw power from a chip energy source during read/write operations, while at the same time allowing the refresh cycle to operate on all ARRAY BANKS when necessary.

Specifically in reference to FIG. 2, the control circuits 29 of ARRAY BANK 3, ARRAY BANK 2, ARRAY BANK 1 and ARRAY BANK 0 are respectively coupled to the outputs of OR circuits 33, 34, 35 and 36. One input of each of OR circuits 33-36 is coupled to the REFRESH CYCLE output of REFRESH DETECTOR AND COUNTER circuit 26. The other inputs of OR circuits 30 and 31 are respectively coupled to the outputs 1-of-4 SELECTOR circuit 37. The enabling input EN of 1-of-4 SELECTOR circuit 37 is coupled to the ARRAY POWER-UP ENABLE output of ROW CLOCKS circuit 27. The inputs of 1-of-4 SELECTOR circuit 37 are coupled to row address RA10 and column address CA10.

Devices such as those illustrated in FIGS. 2 and 3 must be able to distinguish between refresh operation and normal read/write operation, so that all four ARRAY BANKs 20 may be activated during the refresh operation and so that either two (FIG. 2 circuit) or one (FIG. 3 circuit) ARRAY BANKs 20 may be activated during the read/write operations. DRAMs normally have three forms of refresh, RAS-only, hidden, CAS-before-RAS. Hidden refresh and CAS-before-RAS refresh operations are understood by the DRAM before the DRAM actually starts the internal refresh operation, allowing the ARRAY BANK 20 selection to function as described in this specification. However, when using RAS-only refresh, the DRAM may not understand that it is being refreshed (as opposed to being read or written) and, therefore, the DRAM of described herein may not be able to turn on all ARRAY BANKs 20 for refresh. Therefore, RAS-only refresh must be eliminated or two times as many RAS-only refresh operations must be used for the circuit of FIG. 2 (four times as many for the FIG. 3 circuit).

In summary, an integrated circuit memory, such as a DRAM capable of receiving row address signals RA0-10 and column address signals CA0-10, has a plurality of ARRAY BANKs 20. Each ARRAY BANK 20 includes a plurality of memory cells arranged in rows and columns and includes at least one sense amplifier (SENSEAMPS 21). The integrated circuit memory also includes a means, such as row decoders 23 and column decoder 24, for addressing the rows and columns of the ARRAY BANKs 20 in response to the address signals RA0-10 and CA0-10. In addition, the integrated circuit memory includes a means 29, including logic circuits such as OR circuits 30-31 or 33-36, for de-coupling a source of power from at least a part of one of the ARRAY BANKs 20 in response to at least one bit (RA10 and/or CA 10) of the address signals RA0-10 and CA0-10 and in response to a signal from REFRESH DETECTOR AND COUNTER circuit 26. The means for decoupling power from at least a part of one of the ARRAY BANKs 20 may include a means, such as ROW CLOCKS circuit 27 and SELECTORs 32 or 37, for applying electrical power to an ARRAY BANK 20 during periodic refresh cycles.

While the embodiment described herein is a DRAM integrated circuit, it should be noted that the invention is also applicable to other integrated circuits, such as nonvolatile memories arranged in banks of memory cells.

While the invention has been described with reference to an illustrative embodiment, this description is not intended to be construed in a limiting sense. Various modifications of the illustrative embodiment, as well as other embodiments of the invention, will be apparent to persons skilled in the art upon reference to the description. It is, therefore, intended that the appended claims encompass any such modifications or embodiments.

I claim:

1. An integrated circuit memory capable of receiving address signals and capable of being coupled to a source of electrical power, comprising:
   a plurality of array banks, each array bank having a plurality of memory cells arranged in rows and columns;
   means for addressing said rows and columns of each said array bank in response to said address signals;
   means for de-coupling said source of electrical power from at least a part of at least one said array bank in response to at least one bit of at least one said address signal;
   a refresh detector and counter means and including at least one OR circuit having first and second inputs and an output; said output of said OR circuit coupled to said one array bank;
   said first input of said OR circuit coupled to refresh detector and counter means;
   said second input of said OR circuit coupled to said at least one bit of said at least one address signal.

2. The integrated circuit memory of claim 1, wherein said at least one address signal is a row address signal.

3. The integrated circuit memory of claim 1, including a second address signal, wherein said second address signal is a column address signal.

4. The integrated circuit memory of claim 1, wherein said integrated circuit memory is a dynamic random access memory.

5. The integrated circuit memory of claim 1, wherein said integrated memory is a dynamic random-access memory and wherein said means for de-coupling power from at least a part of at least one said array bank in response to at least one bit of at least one said address signal includes a means for applying power to said one array bank during periodic refresh cycles.

6. The integrated circuit memory of claim 1, wherein said means for addressing said rows and columns of said array banks in response to said address signals includes a row decoder and a column decoder.

7. The integrated circuit memory of claim 1, wherein said means for de-coupling power from at least a part of at least one said array bank in response to at least one bit of at least one said address signal includes a logic circuit for allowing refresh of said memory cells of said integrated circuit memory.

8. The integrated circuit memory of claim 1, wherein said means for de-coupling power couples power to said at least a part of said one array bank during reading and writing operations.

9. The integrated circuit memory of claim 1, including a microprocessor for furnishing said at least one bit of said at least one address signal.

10. The integrated circuit memory of claim 1, wherein said at least a part of said one array bank includes at least one sense amplifier.

11. The integrated circuit memory of claim 1, including a row clocks means, wherein said first input of said OR circuit is coupled to said refresh detector and counter means and wherein said second input of said OR circuit is selectively coupled to said at least one bit of said at least one address signal by said row clocks means.

12. A dynamic-random-access integrated circuit memory capable of receiving a row address signal and a column address signal, comprising:
   a plurality of array banks, each array bank including a plurality of memory cells arranged in rows and columns and including at least one sense amplifier;
   a means for addressing said rows and columns of said array banks in response to said address signals, wherein said means for addressing said rows and columns of said array banks in response to said address signals includes a row decoder and a column decoder; and
   a means for de-coupling a source of power from at least a part of at least one said array bank in response to at least one bit of at least one said address signal, wherein said means for de-coupling power from at least a part of said one array bank in response to at least one bit of at least one said address signal includes a means for applying power to said one array bank during periodic refresh cycles;
   wherein said means for de-coupling power from at least a part of said one array bank in response to at least one bit of at least one said address signal includes a logic circuit for allowing refresh of said memory cells of said integrated circuit memory;
   wherein said logic circuit includes a refresh detector and counter means, includes a row clocks means, and includes at least one OR circuit having first and second inputs and an output;
   wherein said output of said OR circuit is coupled to said one array bank, and wherein said first input of said OR circuit is coupled to refresh detector and counter means and wherein said second input of said OR circuit is selectively coupled to said at least one bit of said at least one address signal by said row clocks means.

* * * * *